United States Patent [19]

Necoechea

[11] Patent Number: 5,191,295
[45] Date of Patent: Mar. 2, 1993

[54] PHASE SHIFT VERNIER FOR AUTOMATIC TEST SYSTEMS

[75] Inventor: R. Warren Necoechea, Fremont, Calif.

[73] Assignee: LTX Corporation, Westwood, Mass.

[21] Appl. No.: 849,521

[22] Filed: Mar. 11, 1992

[51] Int. Cl.[5] ............................................. H03D 3/24
[52] U.S. Cl. .................................. 328/155; 328/223; 377/19
[58] Field of Search ...................... 328/155, 223, 104; 377/19; 307/262

[56] References Cited

U.S. PATENT DOCUMENTS

| 4,755,951 | 7/1988 | Hollister | 328/13 |
| 4,785,352 | 11/1988 | Burrowes et al. | 307/356 |
| 5,018,169 | 5/1991 | Wong et al. | 328/155 |

Primary Examiner—John S. Heyman
Assistant Examiner—Scott A. Ouellette
Attorney, Agent, or Firm—Blakely, Sokoloff, Taylor & Zafman

[57] ABSTRACT

A phase shift vernier for providing an output signal with continuously variable delay based on an input phase delay is disclosed. The apparatus comprises delay value means, a ring oscillator, a multiplexer, a DAC, and a signal combiner. The delay value means is adapted for receiving an input phase delay value, indicating the amount of delay for an output signal. The ring oscillator is adapted for circulating an oscillating signal through multiple differential stages to generate multiple quadrature signals. The oscillating signal has a predetermined frequency and each of the differential stages is connected in series. Each of the stages delays its inputs by a predetermined amount to generate its differential outputs from each stage. The multiplexor is coupled to the ring oscillator and to the delay value means to receive the quadrature signals from the ring oscillator. The multiplexor selects first and second quadrature signals from the ring oscillator in response to the input phase delay from the delay value means. The first and second quadrature signals are offset by 90 degrees. The DAC is coupled to the multiplexor and to the delay value means to generate a first and second currents based on the input phase delay from the delay value means. The signal combined is coupled to the DAC and to the multiplexor for generating the output signal phase-shifted by the input phase delay. The signal combiner multiplies the first and second quadrature signals with the first and second currents to generate third and fourth quadrature signals, respectively. The signal combiner further combines the third and fourth quadrature signals to generate the output signal.

11 Claims, 13 Drawing Sheets

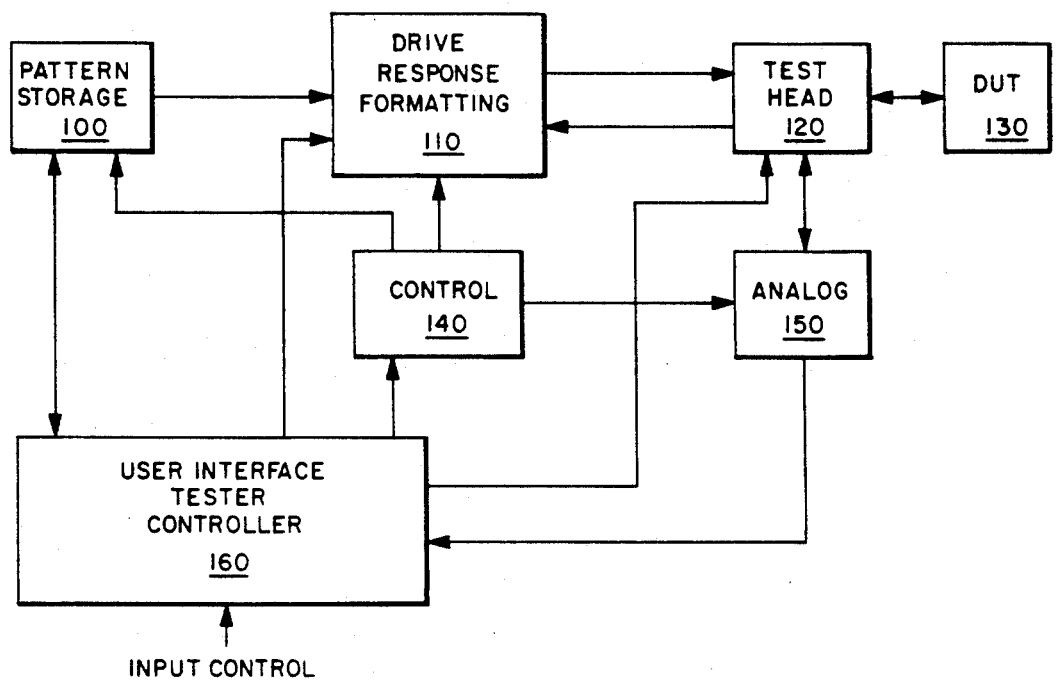
FIG_1 (PRIOR ART)
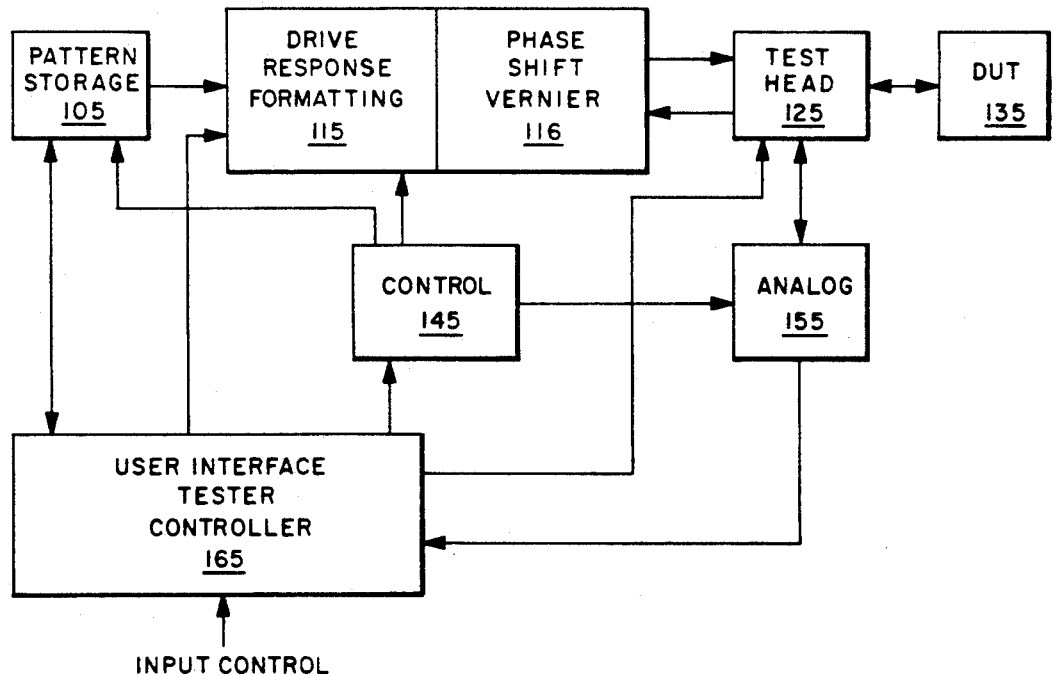
FIG_2

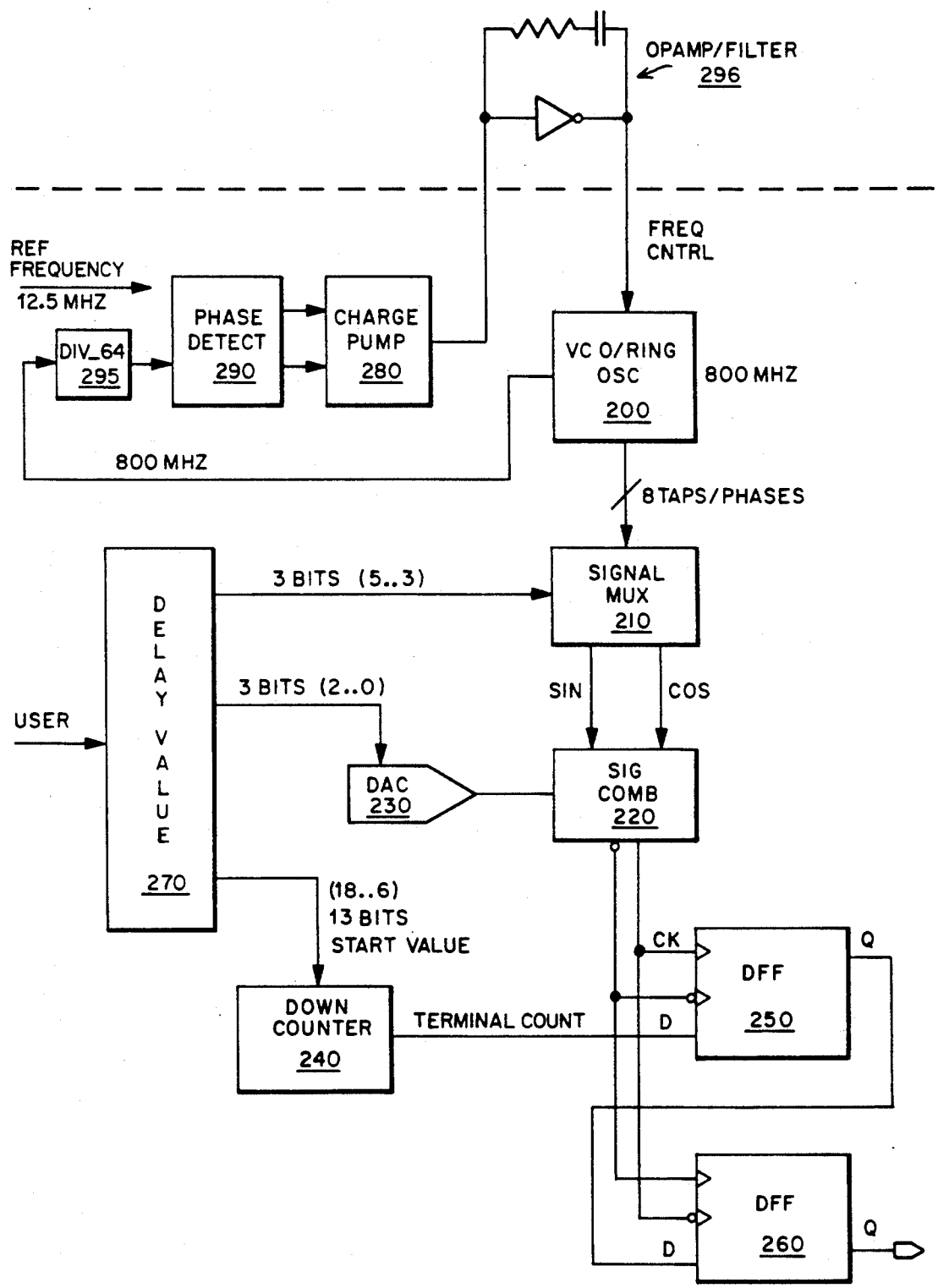
FIG_3

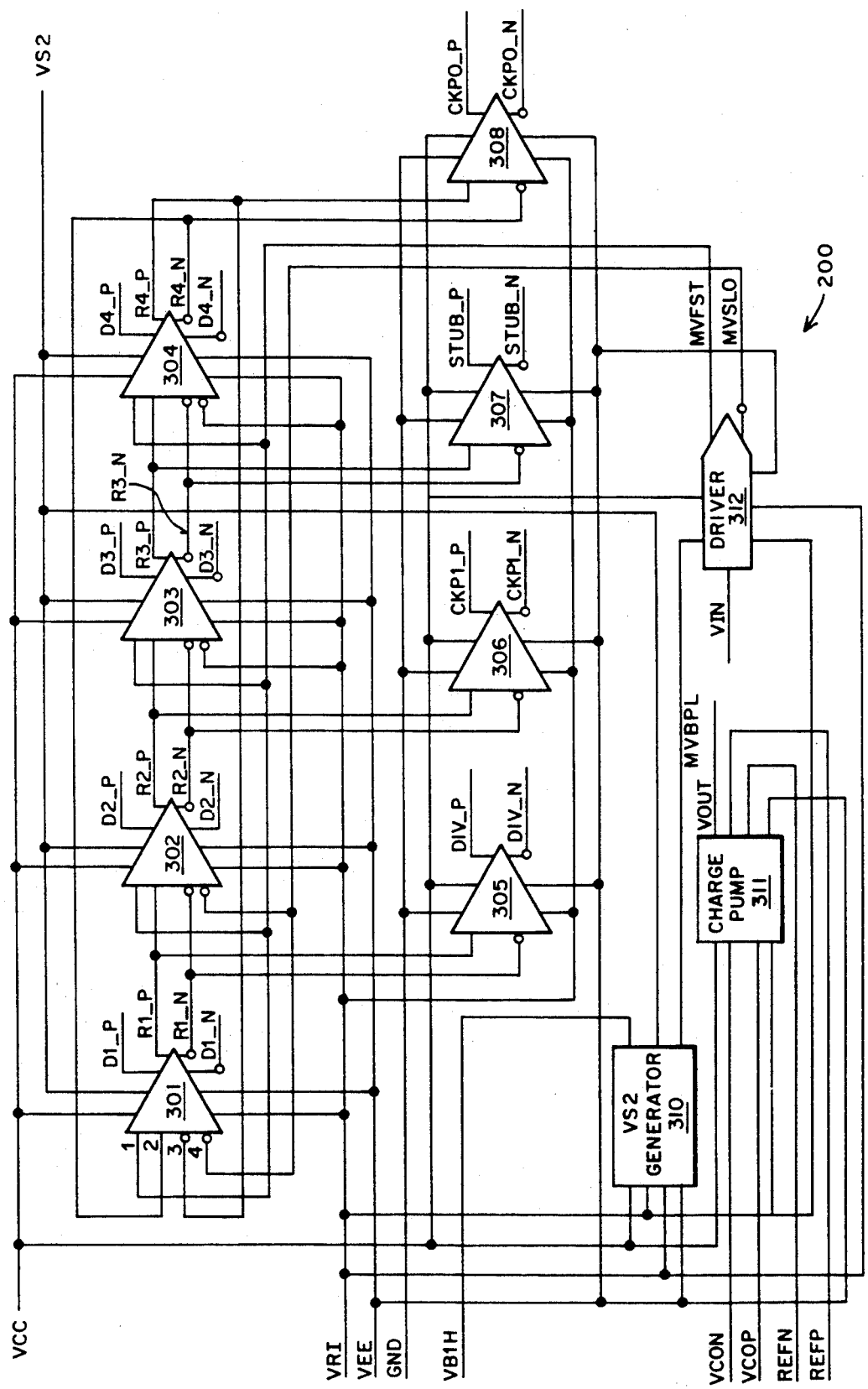
FIG._4

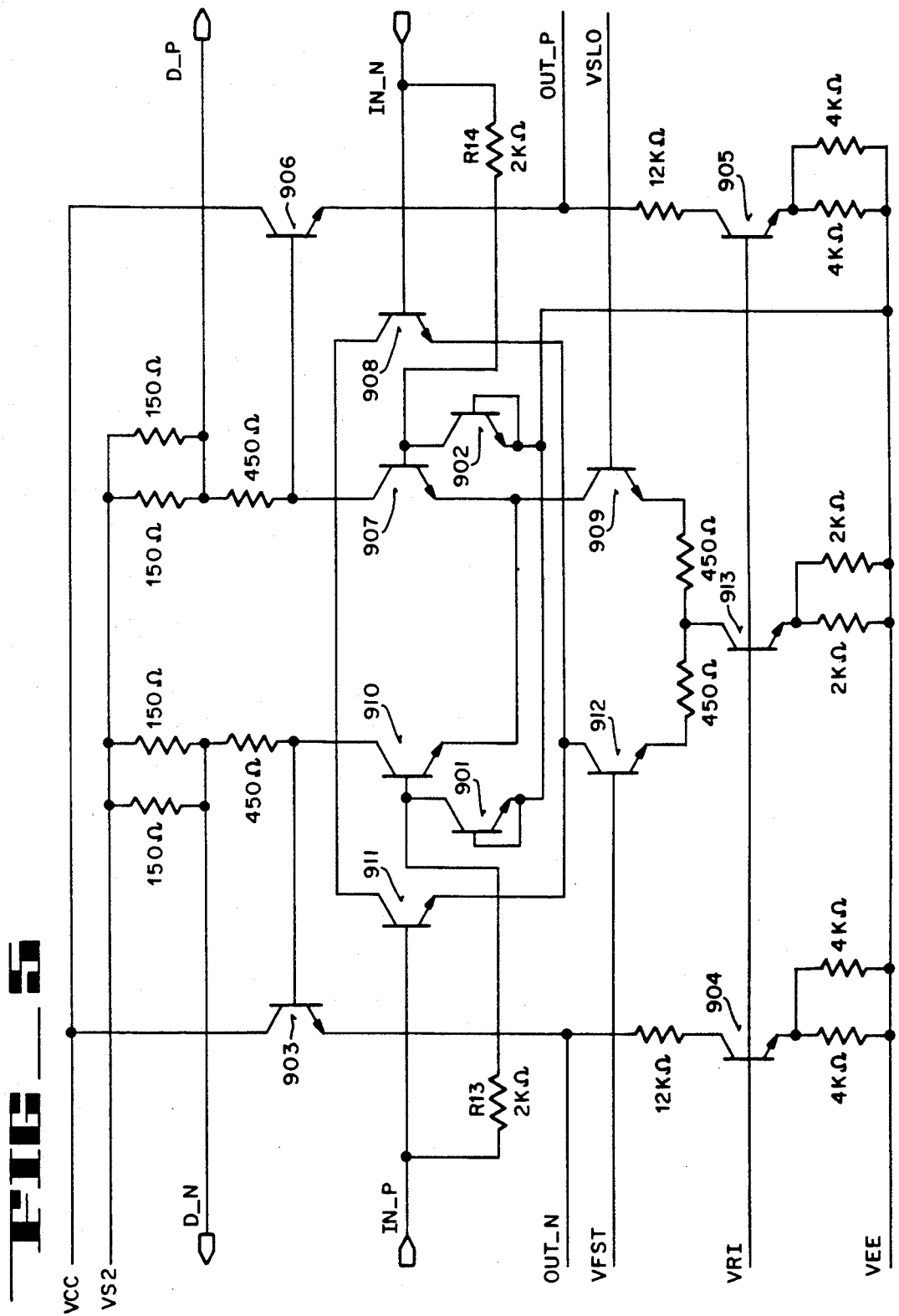
FIG_5

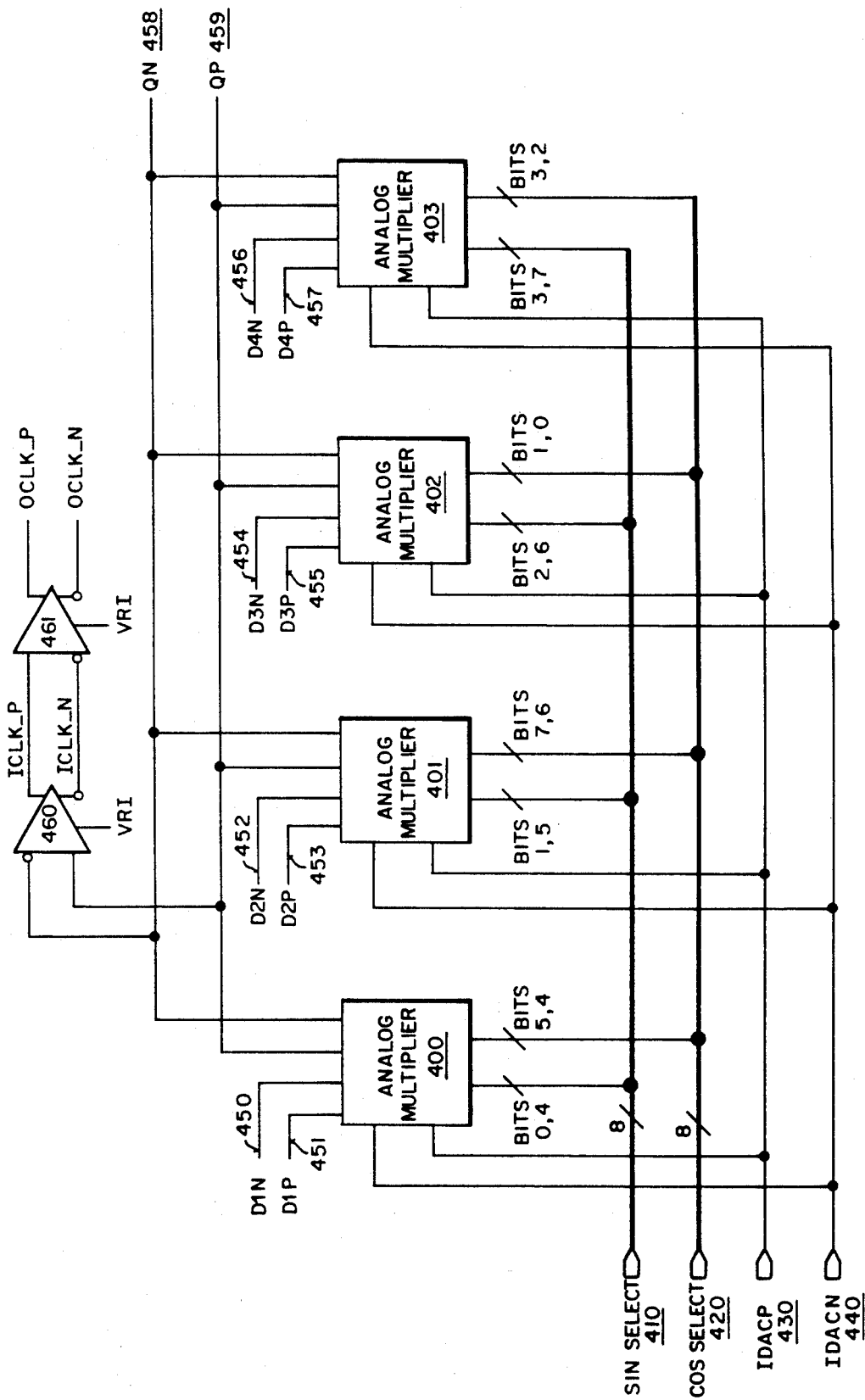
FIG_6

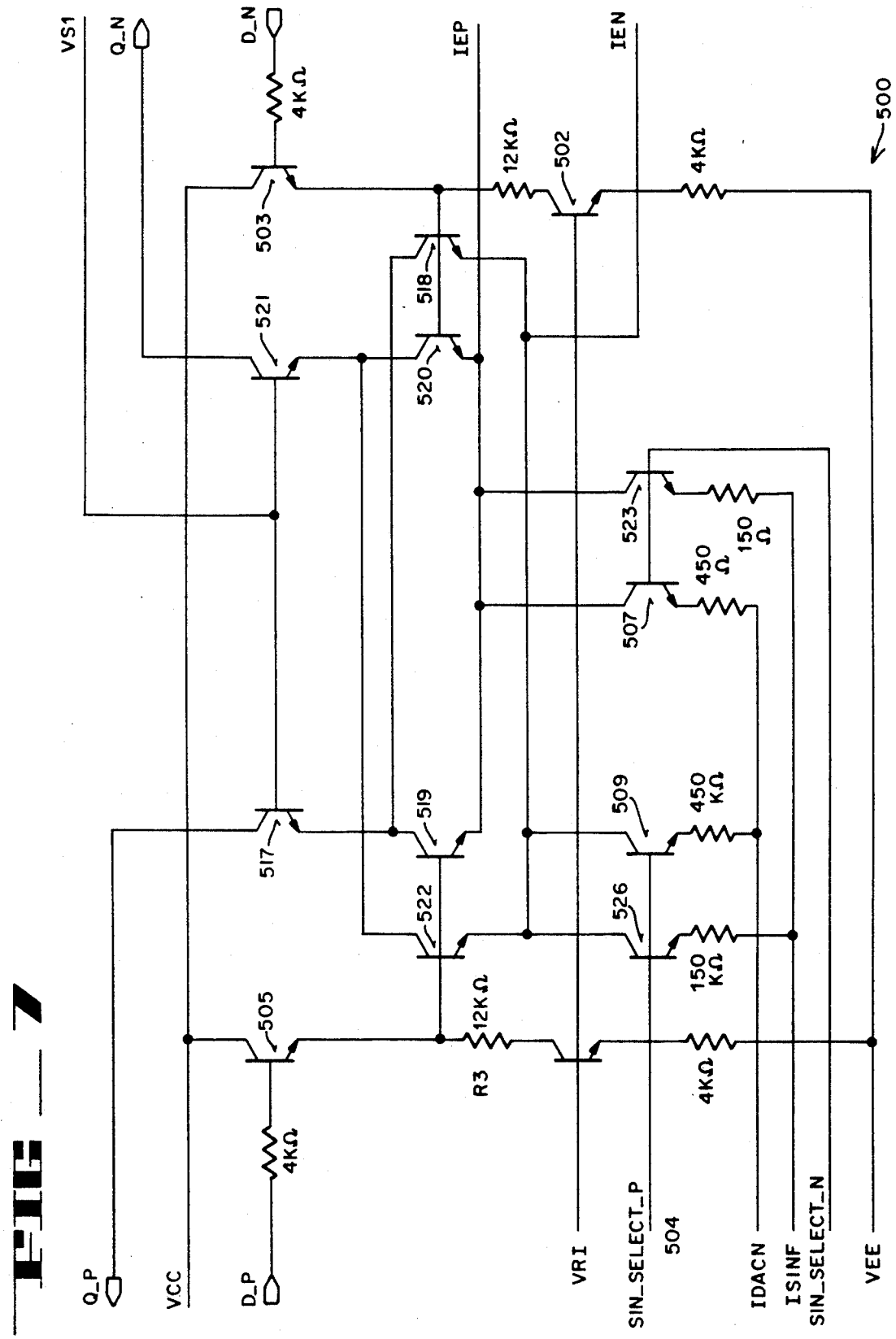
FIG_7

FIG_8
TIMING RETARDED
SINE
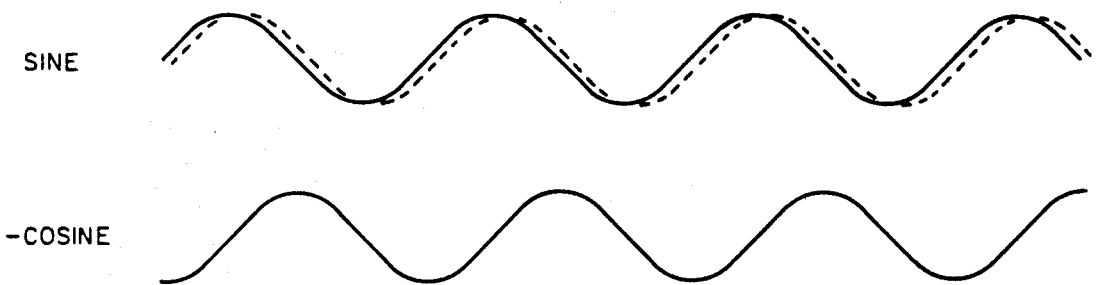
−COSINE
TIMING ADVANCED
SINE
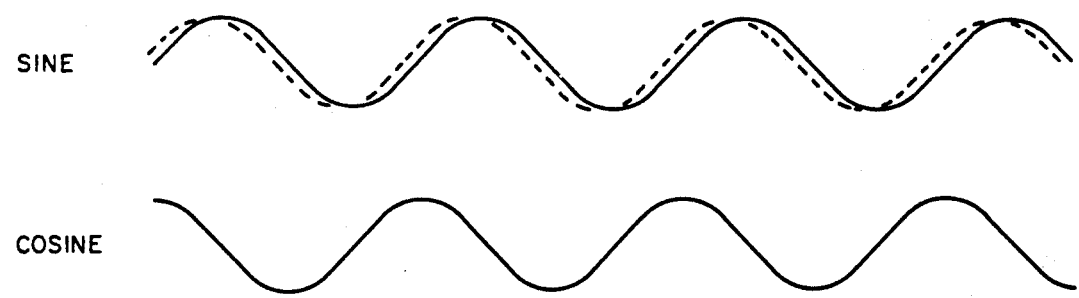
COSINE

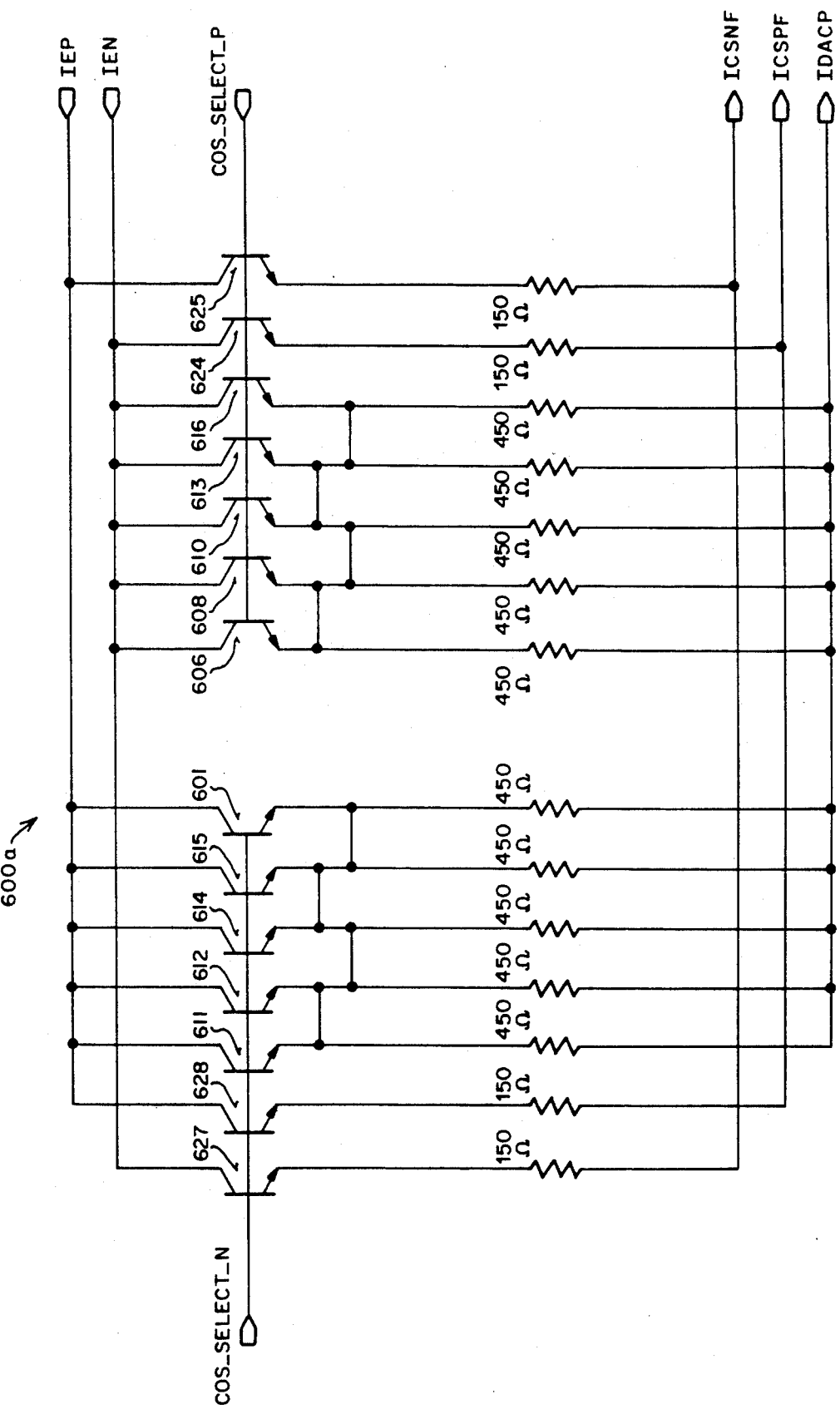
FIG_9A

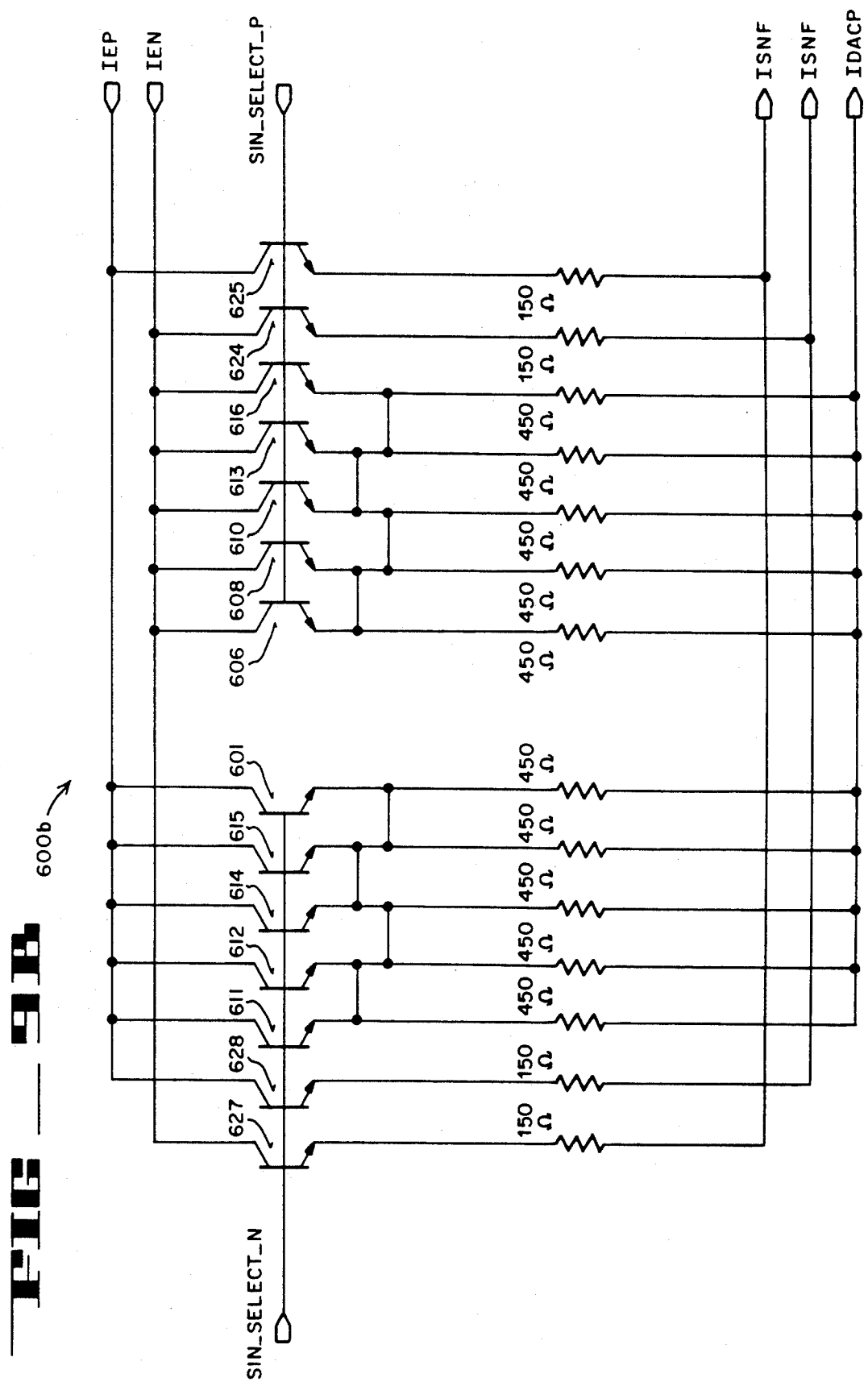

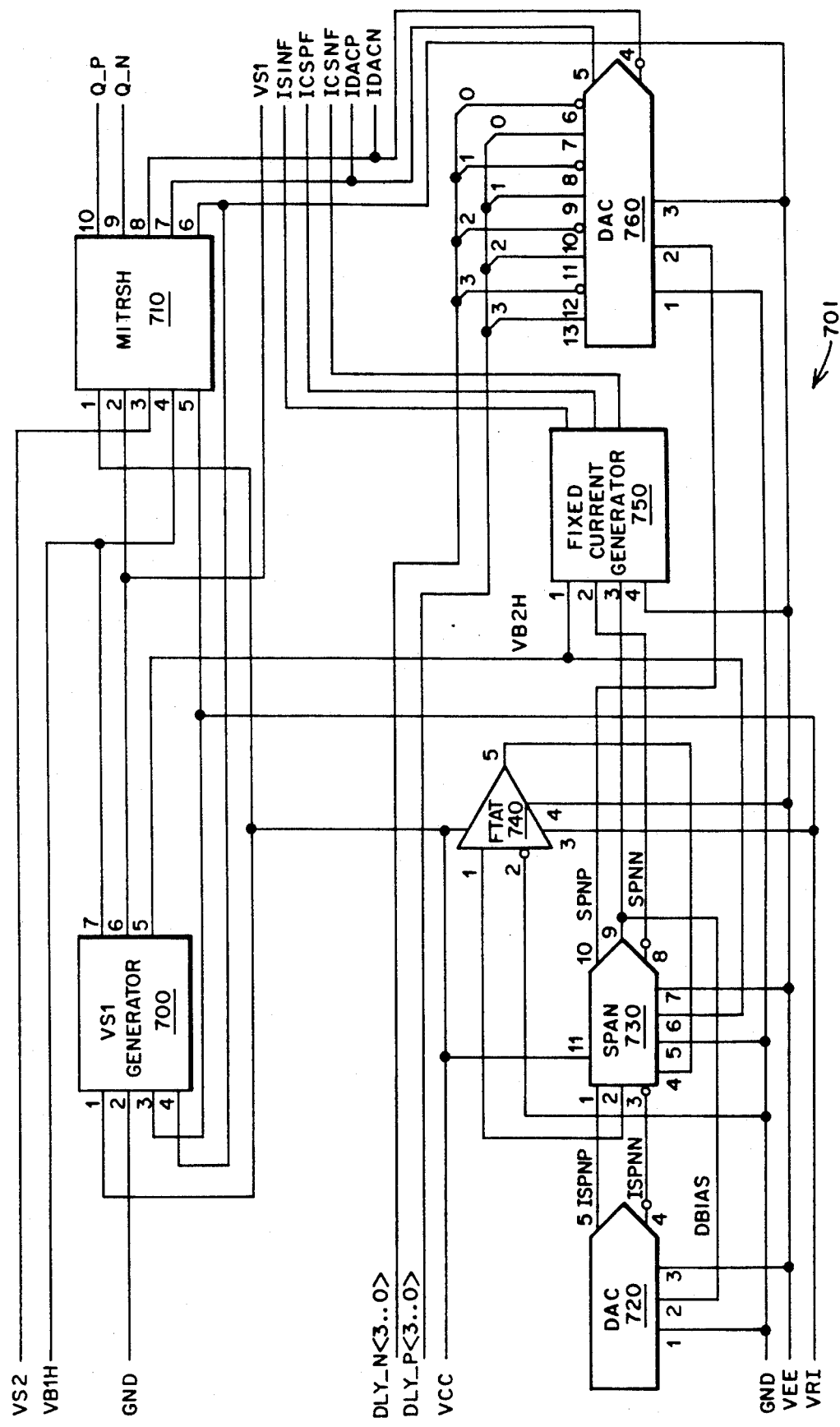
FIG—10

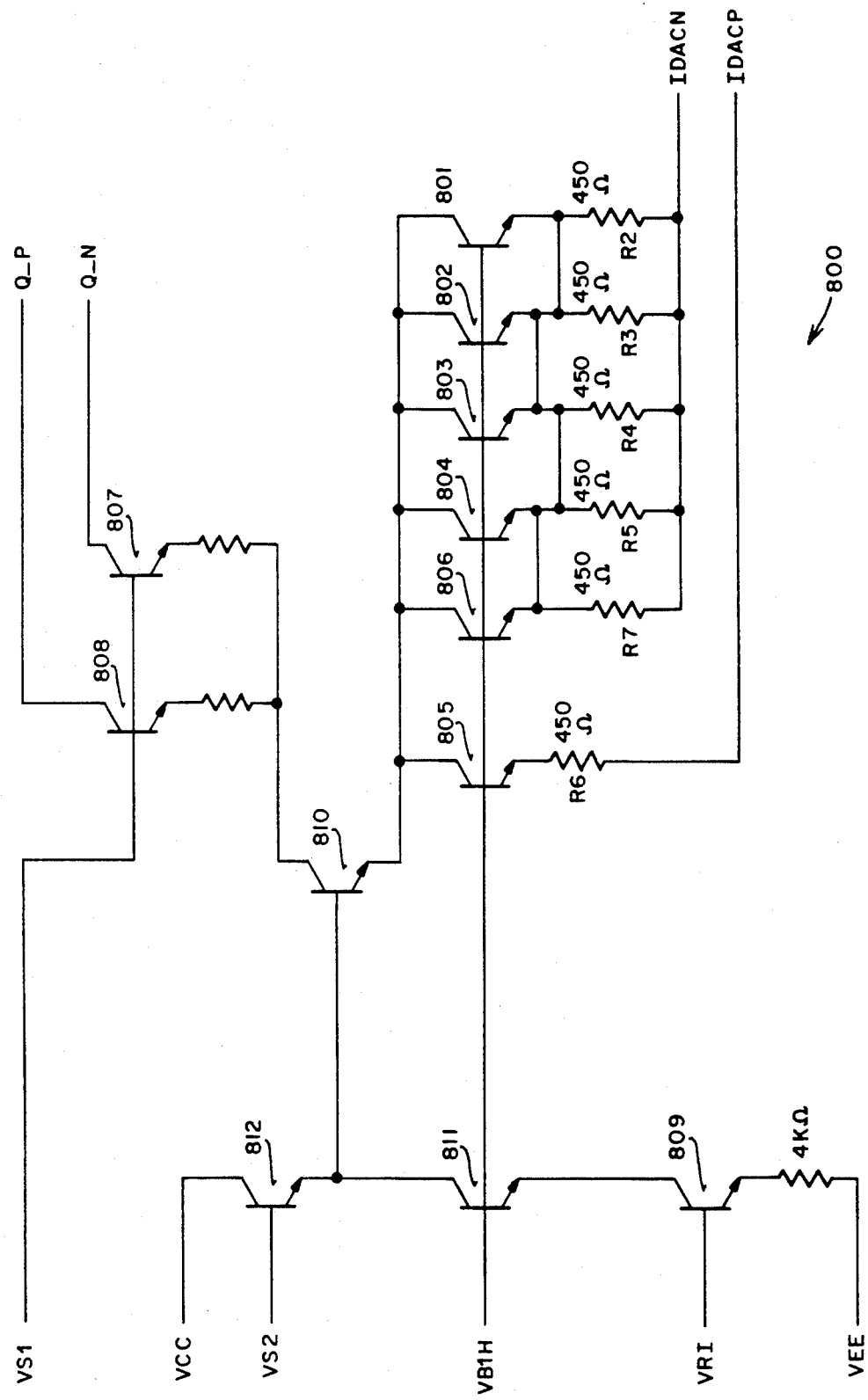
FIG_11

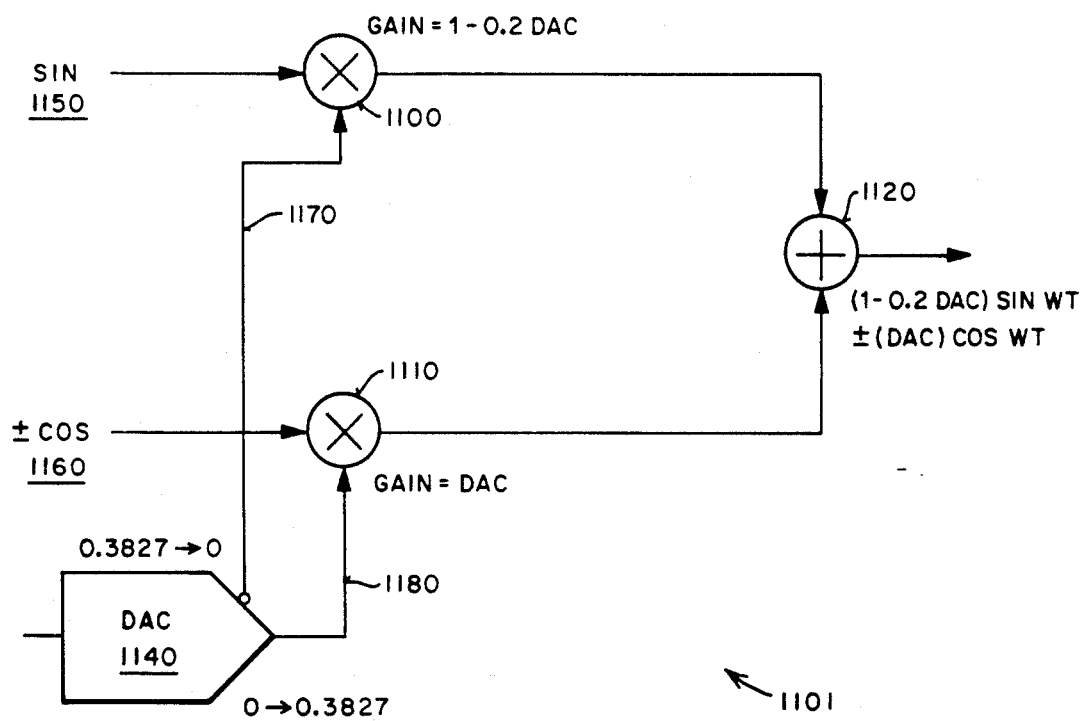
FIG _12

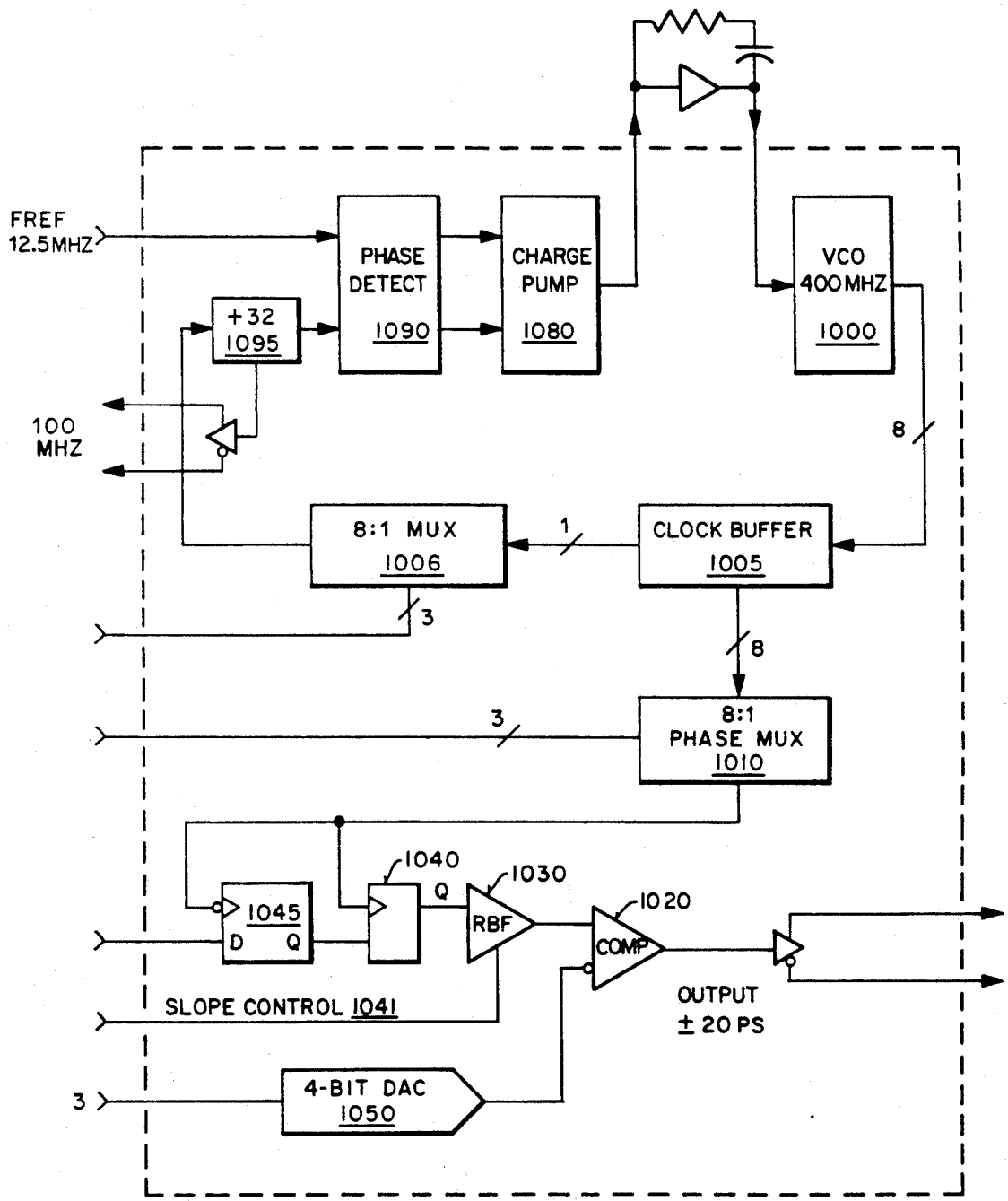
FIG _ 13

PHASE SHIFT VERNIER FOR AUTOMATIC TEST SYSTEMS

FIELD OF THE INVENTION

The present invention relates to automatic test systems for integrated circuit devices and specifically, control of marker placement for evaluating device responses to an input stimulus.

BACKGROUND OF THE INVENTION

In the fabrication of integrated circuit ("IC") devices, automatic test systems ("ATS") play a vital role in ensuring that the fabricated IC devices perform according to their functional specifications. By programming the ATS to provide the devices with a simulated operating environment, the capabilities of the devices can be detected and thereafter improved. With the proliferation of very-large-scale-integration (VLSI) devices, ATSs capable of handling 100 to 200 input/output pins become a requisite link in the fabrication process of IC devices.

FIG. 1 illustrates the functional components of a typical ATS. A test engineer interacts with the ATS through user interface and test controller 160. Initially input data patterns are stored in pattern storage 100, which is essentially a data memory device. The input data patterns from pattern storage 100 are driven to the device-under-test ("DUT") 130 through drive response formatting 110 and test head 120. Drive response formatting 110 controls the timing of the input signal from input data patterns, e.g. when an input signal turns high or low, etc. Test head 120 provides interface with DUT 130 and detects output signal levels from DUT 130. Analog unit 150 is a parametric measuring unit and supplies power to DUT 130 through test head 120. Analog unit 150 also supplies references for test head 120 to interface with DUT 130. Control unit 140 is typically a high speed controller capable of providing looping, changing, and sequencing operations for the input data patterns.

The function of drive response formatting 110 is to provide fine controls of marker placement in the ATS. The control of marker placement involves such parameters as pulse width, edge placements between data and clock, and precise time for evaluating how a device responds to a stimulus. Marker placement can be easily achieved by delaying any given signal. In the prior art, delays are commonly generated in either a ramp delay generator or a gate delayed vernier. In a ramp delay generator, a ramp is triggered by an incoming pulse. A high speed digital-to-analog converter ("DAC") sets a comparator trip point, which is compared to the ramp output. When the ramp output passes the comparator trip point, an output pulse is generated. The delay from the input pulse can thus be made proportional to the programmed DAC voltage, i.e. comparator trip point. Therefore, the higher the trip point setting, the longer the delay from the input pulse.

In a gate delayed vernier, the tapped delay line uses an assortment of gates and multiplexers to set the delay for the incoming pulses. This method recovers very quickly and can be implemented by monolithic construction.

There typically are, however, several disadvantages in the prior art delay generators. For the ramp delay generator, it typically is difficult to make a ramp generator which recovers quickly enough to be retriggered at the rates required for today's high speed ATSs, which typically run at a vector rate of up to 200 MHz. Also, even if a ramp generator can be made to recover quickly, the resulting aberrations typically cause large non-linearities in the delay versus the DAC voltage. Finally, it often is extremely difficult to make a scale factor of delay versus DAC voltage as accurate as required for meshing the vernier with the system clock.

As to the gate delay vernier, the gate delays often vary significantly with process and temperature and therefore must be calibrated in the system. Also, a lookup table typically must be used to convert a programmed delay value to the gate selection since this conversion is non-algorithmic. This table is potentially quite massive and must be accessed at functional speeds of the ATS to be effective.

SUMMARY AND OBJECTS OF THE INVENTION

One object of the present invention is to provide timing delays according to input delay values.

Another object of the present invention is to provide test periods that are not integral multiples of the system clock.

Another object of the present invention is to provide the test periods by using a linear and predictable algorithm to convert programmed values to delays.

Another object of the present invention is to provide retriggering in a fraction of a tester cycle.

A phase shift vernier for providing an output signal with continuously variable delay based on an input phase delay value is disclosed. The apparatus comprises delay value means, a ring oscillator, a multiplexer, a DAC, and a signal combiner. The delay value means is adapted for receiving an input phase delay value, indicating the amount of delay for an output signal. The ring oscillator is adapted for circulating an oscillating signal through multiple differential stages to generate multiple quadrature signals. The oscillating signal has a predetermined frequency and each of the differential stages is connected in series. Each of the stages of the ring oscillator delays its inputs by a predetermined amount to generate its differential outputs. The multiplexor is coupled to the ring oscillator and to the delay value means to receive the quadrature signals from the ring oscillator. The multiplexor selects first and second quadrature signals from the ring oscillator in response to the input phase delay value from the delay value means. The DAC is coupled to the multiplexor and to the delay value means to generate first and second currents based on the input phase delay value from the delay value means. The signal combiner is coupled to the DAC and to the multiplexor for generating the output signal phase-shifted by the input phase delay value. The signal combiner multiplies the first and second quadrature signals with the first and second currents to generate third and fourth quadrature signals, respectively. The signal combiner further combines the third and fourth quadrature signals to generate the output signal.

Other features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements, and in which:

FIG. 1 is a diagram illustrating the functional components of a typical automatic test system.

FIG. 2 is a block diagram illustrating the functional components of an ATS implemented with a phase shift vernier.

FIG. 3 is a functional block diagram of the phase shift vernier.

FIG. 4 is a schematic diagram of the ring oscillator used in the phase shift vernier.

FIG. 5 is a schematic diagram of the delay gate used in the phase shift vernier.

FIG. 6 is a functional block diagram of the signal combiner used in the phase shift vernier.

FIG. 7 illustrates an analog multiplier of the signal combiner used in the phase shift vernier.

FIG. 8 illustrates a phase shifted output.

FIG. 9(a) and 9(b) are schematic diagrams of the cosine and sine select sections of the signal combiner of the phase shift vernier.

FIG. 10 is a schematic diagram of the current control circuit used in the phase shift vernier.

FIG. 11 is a schematic diagram of the MITRSH module for controlling the ratio of current increment in the cosine portion of the signal combiner to current decrement in the sine portion of the signal combiner.

FIG. 12 is a simplified functional block diagram illustrating the analog multiplier within a signal combiner.

FIG. 13 is a simplified functional block diagram illustrating another embodiment.

DETAILED DESCRIPTION

FIG. 2 is a block diagram illustrating the functional components of an ATS with a phase shift vernier of one preferred embodiment included. A test engineer interacts with the ATS through user interface and test controller 165. Input data patterns are stored in pattern storage 105. Phase shift values can be continuously entered as input delay values to each pin of the DUT 135 through each pin's phase shift vernier 116. Input data patterns from pattern storage 105 are driven to DUT 135 through drive response formatting 115 and test head 125. Drive response formatting 115 controls the timing of the input signal to the DUT 135. Test head 125 provides interface with DUT 135 and detects output signal levels from DUT 135. Analog unit 155 is a parametric measuring unit and supplies power to DUT 135 through test head 125. Analog unit 155 also supplies references for test head 125 to interface with DUT 135. Control unit 145 can be a high speed controller capable of providing looping, changing, and sequencing operations for the input data patterns.

The fine resolution algorithm of the present phase shift vernier is derived from trigonometry as follows:

$$\sqrt{a^2 + b^2} \sin[wt + \theta] = a\sin wt + b\cos wt | \theta = \tan^{-1} b/a \quad \text{(Equation 1)}$$

Equation 1 expresses the magnitude and phase relation of a signal when the sine and cosine waves of a time varying function are combined. If the coefficients "a" and "b" are forced to have the sum of their squares is equal to unity, then:

$$\sin[wt + \theta] = \quad \text{(Equation 2)}$$

$$\sqrt{1 - b^2} \sin wt + b\cos wt | \theta = \tan - 1 \, b/\sqrt{1 - b^2}$$

As shown in Equation 2, Equation 1 becomes an expression relating the magnitudes of two quadrature signals to the phase shift of the resultant signal. When Equation 2 is physically realized, the phase shift of a signal can be achieved by varying the amplitudes of two quadrature signals. However, because $\tan^{-1}$ and square-root of $(1-b^2)$ are nonlinear functions, their values must be stored in a lookup table capable of being accessed in system cycle speed, which is typically 5 nanosecond. A preferable alternative is to derive an approximation of Equation 2 and limit its range of values such that the errors are correspondingly limited. The phase shift vernier of the present invention arrives at a linear approximation of Equation 2 as follows:

Approximating the constants in Equation 2, $$\sin[wt+\theta] = [1-n*b] \sin wt + b\cos wt | \theta = \tan^{-1} b/(1-n*b) \quad \text{(Equation 3)}$$

In Equation 3, set $\theta = 22.5$ and $wt = 0$, then $$\sin\theta = b\cos 0 = b = .3827$$

$$\sin(-\theta) = -\sin\theta = b\cos 0 = b = -.3827$$

The value of the constant "n" can then be calculated at "$\theta$" equal to 22.5°. The tangent of 22.5° is 0.41421 which, from Equation 3, is equal to $b/(1-n*b)$. The "n" can be solved as follows:

$$\frac{b}{1 - n*b} = \tan\theta \quad \text{(Equation 4)}$$

The range of "$b$" is: $-0.3827 \leq b \leq 0.3827$ $$b = \tan\theta(1 - n*b) \quad n = \frac{1}{b} - \frac{1}{\tan\theta} = .1989$$

and value of "$n$": $n = 0.1989$

FIG. 3 is a block diagram of a phase shift vernier of one preferred embodiment of the invention. Note that the op-amp/filter 296 is currently implemented outside the integrated circuit of the phase shift vernier (shown below the dashed line). A ring oscillator 200 receives its frequency control from an op-amp/filter 296 to generate an 800 MHz oscillating signal with 8 taps/phases. The PLL ("Phase Locked Loop") circuit comprises a phase detector 290 with a 12.5 MHz reference input, a charge pump 280, an op-amp/filter 296 and a divide-by-64 counter 295. A delay value 270 generated by a user is applied to a signal multiplexer 210 with the 8 taps from the ring oscillator 200, a digital-to-analog converter ("DAC") 230 and a down counter 240, respectively. A signal combiner 220 is coupled to receive sine and cosine signals from the signal multiplexer 210 and analog currents from the DAC 230. The signal combiner 220 has its inverting and noninverting output signals clocking D-type flip-flops 250, 260 to generate the desired phase-shifted output signal.

FIG. 3 shows a 19-bit delay value 270 that can be programmed by the user to indicate the desired phase shift. The PLL circuit provides a frequency control to the ring oscillator 200, which generates an 800 MHz signal with 8 tap outputs. A tap output from the ring oscillator 200 is fed back to the phase detector 290 through a divide-by-64 counter, which will ensure that the frequency of the ring oscillator 200 remains 64 times the reference frequency of 12.5 MHz. The charge pump 280 sinks current and causes the output from the op-amp/filter 296 to go high to accelerate the ring oscillator 200, if the reference frequency to the phase detector 290 leads the divided version of the 800 MHz signal. If the divide-by-64 output leads the reference frequency to the phase detector 290, the charge pump 280 sources current and causes the op-amp output to go low and decelerate the ring oscillator 200. It should be noted that the op-amp/filter 296 is currently implemented external to the integrated circuit containing the other parts of the phase shift vernier.

Sine and cosine signals from the eight tap outputs are selected by three bits, i.e. bits [5,3], of the delay value 270, through the signal multiplexer 210. The sine and cosine signals are proportionally multiplied by currents from the DAC 230, which is controlled by bits [2,0] of the delay value 270. The differential outputs from the signal combiner 220 are connected to clock the D-type flip-flop 250 and reverse-clock the D-type flip-flop 260. The down counter 240 receives a 13 high-order-bit start value from the delay value 270 to count down to a terminal count, when a pulse is output to the D-input of the D-type flip-flop 250. The D-input makes the Q-output go true in synchronization with the signal combiner 220 for approximately one clock cycle. Those skilled in the art will appreciate that the second D-type flip-flop 260 is used to stabilize the propagation time from clock to Q caused by variations in set-up time between the data and clock inputs of the first flip-flop 250. Thus with the reclocking by the D-type flip-flop 260, the Q-output can be fixed relative to the clock of the D-type flip-flop 260. Those skilled in the art will also appreciate that each phase shift vernier can provide a delay control function such as driving the pulse high, driving the pulse low, turning on the pulse, turning off the pulse or strobing the pulse, for each tester pin connecting to a pin of the DUT. Thus, multiple verniers will be needed for each tester pin when multiple delay control functions are implemented in the tester design.

The phase shift vernier is used to detect an output signal at an exact position in time relative to a reference signal for proper strobing of the output. The down counter 240 shown in FIG. 3 is able to facilitate this function to a resolution of 1.25 ns through the 800 MHz clock. With the use of the signal combiner 220 and DAC 230, the phase shift vernier of the preferred embodiment can achieve its function to a resolution of 9.76 ps, which is implemented in two stages.

First, the ring oscillator 200 operates at 800 MHz and is synchronized to a reference frequency at 12.5 MHz such that the problem of distributing an 800 MHz clock throughout the system is avoided. Distributing a 12.5 MHz clock is relatively simple and does not require expensive hardware to accomplish. The ring oscillator 200 provides a resolution of 156 picoseconds for 8 taps as follows: The period of the ring oscillator 200 is two times the sum of the propagation delays ("pd") of the individual delay gates in the ring. Thus, if the oscillator frequency is 800 MHz (i.e. period=1.25 nanoseconds), the average delay of each element can be derived:

$$1.25 ns = (2*tpd\_element*stages)$$

With 4 stages, tpd_element=1.25 ns/(2*4)=156 picoseconds.

Because the ring is fully differential, each stage provides two delay values, i.e. (n*156) ps and 0.625 ps+(n*156) ps, where "n" is the stage number.

Secondly, resolution of 9.7656 picoseconds can be accomplished by dividing each 156 picosecond step into 16 increments. This can be physically realized by combining a fraction of the non-adjacent stage output with the selected stage output, i.e. by adjusting the relative amplitudes of the sine and cosine outputs. For four stage ring oscillator 200, there is one non-adjacent stage for every selected stage.

FIG. 4 is a schematic diagram of the ring oscillator 200. The ring oscillator uses 4 stages of differential delay gates to generate its tap outputs. At each stage the tap output can be either inverting or non-inverting. As such, the ring oscillator produces 8 taps of outputs from four stages of delay gates.

As shown in FIG. 4, the output signals from each delay gate are applied to the inputs of the next delay gate and the outputs of the last delay gate 304 are applied to the inputs of delay gate 301. Outputs R1_P and R1_N from delay gate 301 are also applied to the inputs of line receiver/translator ("LRT") 305 to produce outputs DIV_P and DIV_N. Outputs R2_P and R2_N from delay gate 302 are applied to LRT 306 to produce CKP1_P and CKP1_N. Outputs R3_P and R3_N from delay gate 303 are applied to LRT 307 to produce STUB_P and STUB_N. Outputs R4_P and R4_N from delay gate 304 are applied to LRT 308 to produce CKPO_P and CKPO_N. Note that outputs R4_P and R4_N from delay gate 304 are also circulated back to the inputs at delay gate 301. Signals VS2, VRI, VFST, VSLO are applied to delay gate 301-304. Signal VB1H, representing a reference level of logic high, is applied to the VS2 generator 310. Signals VCON, VCOP, REFN and REFP are applied to charge pump 311 to produce signal VOUT. Signal VIN is applied to delay gate driver 312 to produce signals VFST and VSLO, which varies the speed of the ring oscillator through the delay gates 301-304.

Four LRT's 305-308 are shown in FIG. 4 coupled to the outputs of delay gates 301-304. It should be appreciated by those skilled in the art that the LRT's are voltage translators to translate the input voltage to a lower voltage, currently two-diode drops lower, through emitter-coupled logic ("ECL"). LRT 305, connected between delay gates 301 and 302, generates outputs DIV's to the divider for dividing the ring oscillator output frequency by a factor of 64. LRT 306, connected between delay gates 302 and 303, generates outputs CKP1's as clocks for the logic operations on the chip. LRT 308 similarly generates CKP0's as clocks 90 degrees shifted from CKP1's. Signals STUB's are generated from LRT 307 to provide second order identical loading for the node between delay gates 303 and 304 such that their propagation delay remains the same as other inter-delay gate nodes.

A reference generator 310 generates signals VB1H, VS2, and MVBPL. Signal MVBPL is coupled to a PLL to keep current sources from saturating in the driver 312. Signal VB1H represents a reference logic high, while signal VS2 is coupled to the delay gates 301-304. VS2 provides biasing for all the pull-up resistors in a delay gate by providing a voltage drop of Vcc less one diode drop to the emitter followers in the delay gates (to be described below). The driver 312 receives a signal VIN from the external op-amp/filter (FIG. 2, 296) to generate fast and slow signals, MVFST and MVSLO, respectively, for controlling the four delay gates 301-304. A charge pump 311, driver by signals VCON, VCOP, REFN and REFP from a phase detector, produces a signal VOUT to the external op-amp/filter (FIG. 3, 296). It should be noted that the phase detector implemented in the preferred embodiment is similar to various standard well-known ECL phase detectors, such as Part No. MC12040 available from Motorola Corporation of Schaumburg, Ill.

FIG. 5 is a schematic of a delay gate in the ring oscillator comprising transistors 901 through 913. Inputs IN_P and IN_N to the delay gate are coupled to the bases of transistor 910 through resistor R13, 911 and 907 through resistor R14, 908, respectively. The bases of transistors 910 and 907 are connected to the collectors of transistors 901 and 902, respectively. The bases and emitters of transistors 901 and 902 are coupled to the power rail VEE. The emitters of transistors 908 and 911 are coupled to the collector of transistor 912. The emitters of transistors 907 and 910 are coupled to the collector of transistor 909. Controls VFST and VSLO are applied to the bases of transistors 912 and 909 respectively, which have their emitters coupled to the collector of transistor 913. Reference VRI is applied to the bases of transistors 904, 905 and 913, which are emitter coupled to VEE. Outputs OUT_N and OUT_P of the delay gate appear at the emitters of transistors 903 and 906, respectively, which are coupled to the collectors of transistors 904 and 905, respectively. The bases of transistors 903 and 906 are coupled to the coupled collectors of transistors 910 and 911, and 907 and 908, respectively. Signal D_N is coupled to the base of transistor 903 and the coupled collectors of transistors 910 and 911. Signal D_P is coupled to the base of transistor 906 and the coupled collectors of transistors 907 and 908.

As shown in FIG. 5, a differential pair is formed by transistors 911 and 908, driven by the differential input signals IN_P and IN_N. Transistor 912 supplies the emitter current to the 908-911 pair. Transistors 907 and 910 with resistors R14 and R13, respectively, form another differential pair with emitter current provided by transistor 909. Transistors 901 and 902 act as capacitive loads by having their bases and emitters connected. To achieve the shortest propagation delay through this delay gate, transistor 912 is turned on as a current source for the 908-911 pair, which does not have any capacitive loading and has its differential inputs IN's directly applied. For a long propagation delay, transistor 909 is turned on to provide emitter current for the 907-910 pair, which has capacitive loading and resistors in series with its differential inputs IN's. Because the collectors of transistors 907, 908, 910, and 911 are connected together, the same swing at the collectors can be maintained between fast and slow operations.

It can be appreciated that the emitter resistors shown in FIG. 5 cause gradual shifting of the current from the fast path to slow path, and vice versa. Thus, the proportion of the switching current can be accurately controlled through the VFST and VSLO signals applied to transistors 909 and 912 of the delay gate. Signal VRI, or VCS as commonly found in ECL logic circuits, is used to control the amount of current in the differential pair switches and the emitter followers. It should be noted that signals D_P and D_N, being small swing versions of the internal signals OUT_N and OUT_P are phases outputting from ring oscillator, while OUT_N and OUT_P are applied to the next delay gate as input signals. Signal VS2 is a reference voltage providing biasing for all the pull-up resistors in the differential buffer by lowering Vcc by one diode drop. As a result, the emitter followers 903 and 906 have their collector-base junction reverse biased to allow the capacitance to decrease accordingly. With a lower capacitance, the delay gate can be made faster than normal.

FIG. 6 is a functional block diagram of the signal combiner. Both ranges of resolution are provided by the signal combiner. First, select signals SIN_SELECT 410 and COS_SELECT 420 can provide a resolution down to 156 pico second by selecting a particular one of analog multipliers 400-403. Second, by controlling the input currents IDACP 430 and IDACN 440 to the particular analog multipliers, the delay of the clock can be reduced down to 9.76 pico second resolution.

Each pair of the tap outputs from the ring oscillator D1N and D1P, D2N and D2P, D3N and D3P, D4N and D4P are applied to analog multipliers 400 through 403, respectively. Control signals SIN _SELECT 410, COS _SELECT 420, IDACP 430, and IDACN 440 are applied to each of the analog multipliers 400 through 403. Note that two different bit lines from SIN _SELECT 410 are applied to each analog multiplier 400-403; Bits 0 and 4 to analog multiplier 400, bits 1 and 5 to analog multiplier 401, bits 2 and 6 to analog multiplier 402, and bits 3 and 7 to analog multiplier 403. Similarly, for the COS _SELECT 420 lines, bits 4 and 5 are applied to analog multiplier 400, bits 7 and 6 to analog multiplier 401, bits 1 and 0 to analog multiplier 402 and bits 3 and 2 to analog multiplier 403. Buffer/translator 460 receives the QN and QP signals to generate input clocks, which are applied to buffer 461 to generate output clocks OCLK_P and OCLK_N for positioning the timing pulse.

By enabling the signal combiner, the tap outputs from the ring oscillator can be selected. By controlling the gain of the signal combiner, the phase can be varied by ±22.5° in 2.8125° increments (9.76 ps). The signals D1N and D1P 450, 451, D2N and D2P 452, 453, D3N and D3P 454, 455, and D4N and D4P 456, 457, are the phase outputs from the ring oscillator (as shown in FIG. 3) into each of the analog multipliers 400-403. The signal SIN _SELECT 410 selects the positive or negative sine configuration of the signal combiner with respect to the positive and negative tap outputs from the ring oscillator. The signal COS _SELECT 420 selects the positive or negative cosine configuration of the signal combiner in a similar way to the signal SINE_SELECT 410. The signal IDACP 430 is a DAC output current which increases with digital input code. IDACN 440 is the DAC output current which decreases with digital input code. IDACP controls the gain of the multiplier providing the cosine term and IDACN controls the gain of the multiplier providing the sine term. After the outputs from the ring oscillator are selected and multiplied by the analog multipliers 400-403, outputs which approximate Equation 3 appear as QN 458 and QP 459. It should be noted that the current implementation does not require an adder to add the output signals from analog multipliers 400-403. The signals are combined on the signal lines directly out of the analog multipliers 400-403 and applied through the buffer pair 460 and 461.

FIG. 7 shows an analog multiplier 500 within the signal combiner. Each analog multiplier, from the signal combiner comprises transistors 502, 503, 504, 505, 507, 509, 517, 518, 519, 520, 521, 522, 523 and 526. Tap signals D_P and D_N from the ring oscillator are applied to the bases of transistor 505 and 503, respectively. The emitter of transistor 505 is coupled to the bases of transistors 519 and 522 and coupled to the collector of transistor 504. The emitter of transistor 503 is coupled to the bases of transistor 518 and 520 and coupled to the collector of transistor 502. The reference signal VRI is applied to the bases of transistor 502 and 504. Signals SIN _SELECT_P and SIN _SELECT_N are applied to the bases of transistors 509 and 526, 507 and 523, respectively. Signals IDACN and ISINF are connected to the emitters of transistors 507 and 509, and 523 and 526, respectively. The collectors of transistors 509 and 526 are coupled to the emitters of transistors 518 and 522. The collectors of the transistors 507 and 523 are coupled to the emitters of transistors 519 and 520. Signals IEP and IEN are coupled to the collectors of transistors 507 and 523, and collectors of transistors 509 and 526, respectively. The collectors of transistors 518 and 519 are coupled to the emitter of transistor 517. The collectors of transistors 520 and 522 are coupled to the emitter of transistor 521. The outputs Q_P and Q_N from the analog multiplier appear at the collectors of transistors 517 and 521, respectively, which have their bases coupled to signal VS1.

As shown in FIG. 7, the analog multiplier 500 consists of a set of bipolar, cross-coupled, differential pairs and four lower level differential pairs. The input to the cross-coupled pair is connected to one of the four stages on the ring oscillator, thus allowing either phase of that stage to be transmitted to the output. The fine control of the phase shift vernier can be achieved by adjusting the relative amplitudes of the sine and cosine waveforms, which is reflected as the gain of the differential pair proportional to the common mode current. When a positive sine configuration of the signal combiner is asserted, a common mode, fixed current ISINF and variable current IDACN flow through the non-inverting cross-coupled differential pairs. Current ISINF is equivalent to the number "1" and variable current IDACN is equivalent to the variable "−n*b" in Equation 4. On the other hand, when the negative sine configuration is asserted, the common mode, fixed current ISINF and variable current IDACN flow through the inverting cross-coupled differential pairs.

The select logic is configured such that when the SIN_SELECT_P (or SIN_SELECT_N) is asserted, COS_SELECT_P (or COS_SELECT_N) of the non-adjacent signal combiner is also high. When COS_SELECT_P is high, the phase of the resulting output is advanced (or retarded). When COS_SELECT_N is high, the phase of the resulting output is retarded (or advanced). As shown in FIG. 8, the dash lines indicate a phase shifted signal for the sine wave.

FIGS. 9(a) and 9(b) are schematic diagrams of the cosine and sine select sections 600(a) and 600(b) within the signal combiner. As shown in FIG. 9(a), the control circuit 600(a) comprises transistors 601, 606, 608, 610, 611, 612, 613, 614, 615, 616, 624, 625, 627 and 628. Signal COS_SELECT_N is coupled to the bases of transistors 601, 615, 614, 612, 611, 628 and 627, whereas signal COS_SELECT_P is coupled to the bases of transistors 606, 608, 610, 613, 616, 624 and 625. The emitters of transistors 601, 615, 614, 612 and 611 are coupled together and to signal IDACP. The emitters of transistors 606, 608, 610, 613 and 616 are coupled together and also to the signal IDACP. The emitters of transistors 624 and 628 are coupled to signal ICSPF. The emitters of transistors 625 and 627 are coupled to the signal ICSNF. Signal IEP is coupled to the collectors of transistors 628, 611, 612, 614, 615, 601 and 625. The signal IEN is coupled to the collectors of transistors 627, 606, 608, 610, 613, 616 and 624. When COS_SELECT_P (or COS _SELECT_N) is selected, both cross-coupled differential pairs received fixed currents ICSPF and ICSNF. This fixed current keeps the relative operating parameters (Ft, Cje, etc.) of the cosine mode signal combiner (COS_SELECT_P, COS_SELECT_N=high) equal to those of the sine mode signal combiner (SIN_SELECT_P, SIN_SELECT_N=high) for low values of cosine signal amplitude. A second current, IDACP, also flows through the non-inverting and inverting differential pair when COS_SELECT_P (or COS_SELECT_N) is high. It is this current which creates the imbalance between the cross-coupled pairs and thereby controls the amplitude of the cosine waveform.

Effectively, transistors 611, 612, 614, 615, 601, 606, 608, 610, 613 and 616 act as a termination for the current sink IDACP by controlling the proportion of the DAC current into the signal combiner which adjusts the cosine component. If either one of COS_SELECT_N or COS_SELECT_P inputs is selected, it causes the gain of the signal combiner acting as the cosine element to adjust its gain. When COS_SELECT_N is high and COS_SELECT_P is low, then the negative of the cosine will add to the sine component, i.e., (sin minus cos). Conversely, when COS_SELECT_N is low and COS_SELECT_P is high, the positive of the cosine will add to the sine component, i.e. (sin+cos). Additionally, the magnitude of the cosine component is determined by the current through IDACP. It should be apparent to those skilled in the art that FIG. 9(b) is identical to FIG. 9(a) with the exception that the select signals are for the sine term. As such, the magnitude and sign of the sine term can similarly be determined with the circuit shown in FIG. 9(b).

FIG. 10 is a schematic of the current control circuit 701 as implemented with the phase shift vernier. As shown in FIG. 10, the signal VB1H is coupled to VS1 generator 700 and MITRSH 710. Signals DLY_N [3,0] and DLY_P [3,0] are coupled to DAC 760. Reference VRI is applied to op-amp 740, VS1 generator 700 and MITRSH 710. Signal VS1 is coupled to VS1 generator 700 and MITRSH 710. Signals ISINF, ICSPF and ICSNF are from fixed current generator 750. Signals IDACP and IDACN are from DAC 760 and coupled to MITRSH 710. The output signals from DAC 720, ISPNP and ISPNN are coupled to SPAN 730. SPAN 730 is coupled DAC 760 through SPNP signal SPNN coupled between SPAN 730 and fixed current generator 750. Output FTAT from op-amp 740 is coupled to SPAN 730.

As shown in FIG. 10, currents ISINF, ICOSP, and ICOSN are generated by the fixed current generator 750. IDACP and IDACN are generated by a current steering DAC (the standard configuration for a bipolar DAC). A second DAC, identical in structure to the first DAC, adjusts the ratio of the fixed currents to IDACP and IDACN. This ratio controls the exact time span of the fine range of the phase shift vernier as shown in FIG. 9(a) and 9(b).

As shown in FIG. 10, DAC 760 adjusts the delay value as inputted from DLY_N by controlling the signal combiner through currents IDACP and IDACN, which control the relative gain of the sine and cosine paths in the signal combiner. DAC 720 is used to adjust the span of DAC 760 by looping with SPAN 730 and op-amp 740 to adjust the relative magnitudes of fixed currents ISINF (sine fixed current), ICSPF (cosine positive fixed current) and ICSNF (cosine negative fixed current), and variable currents IDACP and IDACN (positive and negative variable currents). Signals SPNP and SPNN from SPAN 730 increase and decrease, respectively, according to the input current ISPNP and ISPNN. In combination, the DAC 720, SPAN 730 and op-amp 740 control the relative magnitudes of IDACP vis-a-vis ISINF, ICSP and ICSN to determine whether the 22.5 degrees of range by DAC 760 can be achieved.

The fixed current generator 750 shown in FIG. 10 generates fixed reference currents ISINF, ICSPF, and ICSNF. MITRSH 710 is provided to adjust the proportion of the changes to IDACP and IDACN to maintain the amplitude of the resultant sine-cosine combination signal constant. As illustrated in Equation 4, as the current for the cosine signal is increased to cause a phase shift, the current for the sine signal should be decreased to keep the amplitude of the resultant signal fixed. MITRSH 710 adjusts the proportion of the currents because the amount increased is not equal the amount decreased, as shown in Equation 4. Currently, MITRSH 710 is also used to combine IDACP and IDACN back together to create two equal outputs Q_P and Q_N to keep the DC level at the output of the signal combiner from shifting.

FIG. 11 is the MITRSH module 800 for controlling the ratio of current increment in the cosine portion of the signal combiner to current decrement in the sine portion of the signal combiner shown in more detail. The MITRSH module as shown in FIG. 11 comprises transistors 801 through 812. Reference VB1H is coupled to the bases of transistors 801 through 806, and 811. The collectors of transistors 801 through 806 are coupled to the emitter of transistor 810. The emitter of transistor 812 is coupled to the base of transistor 810 and the collector of transistor 811. VS2 applies to the base of transistor 812. VS1 is coupled to the bases of transistors 807 and 808, which have their emitters coupled to the collector of transistor 810. Signals Q_P and Q_N are coupled to the collectors of transistors 808 and 807 respectively. Signal VRI appears at the base of transistor 807, which has its collector coupled to the emitter of transistor 811. The emitters of transistors 801, 802, 803, 804 and 806 are coupled together and further coupled to the signal IDACN, whereas the emitter of transistor 805 is coupled to the signal IDACP.

The module determines the value of "n" in the Equation 3 by using the resistor ratios. Five emitter resistors in the cosine mode signal combiner and one emitter resistor are connected to current IDACP. Five emitter resistors in the MITRSH and one emitter resistor in the sine mode signal combiner are connected to signal IDACN, as shown in FIGS. 7 and 11. Thus, IDACP is split 5:1 between the cosine mode and MITRSH, and IDACN is split 5:1 between MITRSH and the sine mode. If the portion of the IDACP which flows into the cosine mode signal combiner is "b", the portion of IDACN which flows into the sine mode signal combiner is "b"/5 and "n" is equal to 0.2. This is within 1.1% of the calculated value for "n".

The signal VB1H is shown in FIG. 11 as a reference level of a logic high. It should be noted that in ECL, there are generally upper and lower logic levels, i.e. VB1 and VB2. Typically, VB1H is at −0.8 v, VB1L at −1.3 v, VB2H at −1.5 v and VB2L at −2.0 v. Five resistors R2, R3, R4, R5, R7 are shown connected in parallel to draw 5/6 of the current at IDACN, whereas resistor R6 draws 1/6 of the current at IDACP such that (1/6)/(5/6) is equal to 0.2, which generates the necessary 0.2 multiplier for the sine term in Equation 4.

FIG. 12 is a simplified diagram of the analog multiplier 110. It should be noted that multipliers 1100 and 1110 and combiner 1120 are within the signal combiner as shown in FIG. 6. A signal representing the sine term 1150 is multiplied with the multiplier from DAC 1140 at the multiplier 1100. A signal representing the cosine term 1160 is multiplied by the multiplier 1180 from DAC 1140 at the multiplier 1110. The product of the two multipliers are combined at the adder 1120 to generate a desired signal. When the output of DAC is 0, the sine term passes without phase shift. As the DAC goes from 0 to 0.3827, the gain and the multiplier changes in phase shift is ±22.5°. It should be apparent to those skilled in the art that a change in the sign of the cosine term results in changes in the direction of the phase shift. The sine and cosine inputs can come from any of the 8 tap outputs from the ring oscillator as decided by the signal multiplexer in the signal combiner.

FIG. 13 is a block diagram of one alternative embodiment of the present invention. The PLL circuit provides the frequency control to the voltage-controlled oscillator ("VCO") 1000, which is currently implemented in gate-array to oscillate at 400 MHz. The VCO 1000 generates 8 taps/phases through a clock buffer 1005 to the 8:1 phase multiplexer 1010. The phases selected now have 312.5 pico second resolution, instead of 156 pico second resolution from the 800 MHz oscillator. The phases clock and reclock D-type flip-flops 1045, 1040 to offset the setup time caused by the delay between the D-input and the clock inputs. The output of the D-type flip-flop 1040 is input to a ramp generator 1030, which generates a negative ramp with adjustable slope control 1041. The ramp output from the ramp generator 1030 is compared with an analog signal from the 4-bit DAC 1050.

As in the bipolar implementation shown in FIG. 3, a four stage differential ring oscillator can also be constructed with each stage being tapped and buffered. Two multiplexers select the clock phase applied to the internal logic of the timing generator array and the time delay vernier respectively.

As described, the phase shift vernier of one preferred embodiment is a departure from certain typical prior art techniques. The phase shift vernier addresses more than the requirement of a time vernier and is directed to the means of generating timing for the entire ATS. The phase shift vernier addresses the following problems, for example. In distributing clocks in high speed ATS's, one preferred embodiment allows the clock to run at 800 MHz, which approaches the upper end of the UHF band. One preferred embodiment also allows the generation of test periods that are not integral multiples of the clock period by using a linear and predictable algorithm for converting programmed values to delays. One preferred embodiment also allows retriggering of the vernier in a fraction of a tester cycle.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are accordingly, to be regarded in an illustrative rather than a restrictive sense.

What is claimed is:

1. A phase shift vernier for an automatic test system for testing integrated circuit devices, said phase shift vernier providing an output signal from an integrated circuit device with continuously variable delay based on an input phase delay value, comprising:
   delay value means for receiving said input phase delay value, said input phase delay value indicating an amount of delay for said output signal from said integrated circuit device;
   ring oscillator means for circulating an oscillating signal through a plurality of differential stages to generate a plurality of pairs of quadrature signals with a plurality of phase delays, said oscillating signal having a predetermined frequency, each of said differential stages being connected in series, each of said stages phase-shifting its inputs by a predetermined phase delay to generate its differential outputs from each stage;
   multiplexor means coupled to said ring oscillator means and to said delay value means for receiving said plurality of pairs of quadrature signals from said ring oscillator means, said multiplexor means selecting first and second signals from said plurality of pairs of quadrature signals from said ring oscillator means in response to said input phase delay value from said delay value means;
   DAC means coupled to said multiplexor means and to said delay value means for generating first and second currents, said DAC means generating a current amplitude ("M") based on a predetermined number of least significant bits of said input phase delay value from said delay value means, said first and second currents having an amplitude ratio of $(1-0.2*M)/M$;
   combiner means coupled to said DAC means and to said multiplexor means for generating said output signal whose phase is said first quadrature signal shifted by said input phase delay value, said combiner means multiplying said first and second quadrature signals with said first and second currents to generate third and fourth quadrature signals, respectively, said third and fourth quadrature signals having amplitudes equal to the amplitudes of said first and second currents, respectively, said combiner means further adding said third and fourth quadrature signals to generate said output signal shifted by said input phase delay value.

2. A phase shift vernier according to claim 1, further comprising:
   down counter means coupled to said delay value means for counting down to a terminal count from a start value, said start value being a most significant portion of said input phase delay value;
   first D-type flip-flop coupled to receive as an input said terminal count and as clocks inverting and noninverting signals of said output signal from said combiner means, said first D-type flip-flop generating an output by clocking said terminal count; and
   second D-type flip-flop coupled to receive the output from said first D-type flip-flop as input and to clock said input by the non-inverting and inverting signals of said output signal from said combiner means.

3. A phase shift vernier according to claim 2, further comprising PLL means coupled to said ring oscillator means for controlling said predetermined frequency of said ring oscillator means.

4. A phase shift vernier according to claim 3, wherein said PLL means comprises:
   frequency divider means coupled to said ring oscillator means for dividing said predetermined frequency to a first frequency;
   phase detector means coupled to said frequency divider means for receiving said first frequency and a reference frequency and detecting a phase difference thereof;
   filter means coupled to said ring oscillator means and to said phase detector means for adjusting current to said ring oscillator means to control the speed of said ring oscillator means.

5. A phase shift vernier according to claim 1, wherein each of said differential stages in said ring oscillator means for generating differential quadrature signals comprises:
   first pair of transistors for generating fast differential outputs, said first pair of transistors receiving differential inputs at the bases thereof, said first pair of transistors having emitters connected together;
   first driver coupled to the emitters of said first pair of transistors at a collector thereof, said first driver supplying emitter current to said first pair of transistors in response to a first signal;
   second pair of transistors for generating slow differential outputs, said second pair of transistors also receiving said differential inputs at the bases thereof, said second pair having emitters connected together, said second pair having capacitive loading transistors coupled to their bases and resistors between said differential inputs and their bases, collectors of said first and second pairs are connected such that the same swing is maintained between said fast and slow differential outputs.

6. A phase shift vernier according to claim 5, wherein said capacitive loading transistors are transistors having bases and emitters connected together.

7. A phase shift vernier according to claim 1, wherein said ring oscillator means circulates said oscillating signal through 4 differential stages to generate 8 quadrature signals.

8. A phase shift vernier according to claim 1, wherein said combiner means comprises:
   a plurality of analog multipliers, each of said analog multipliers coupled to receive first and second quadrature outputs from each stage of said ring oscillator means;
   selector means coupled to each of said plurality of analog multipliers for selecting first and second signals from among said quadrature outputs from said ring oscillator means;
   current means coupled to each of said plurality of analog multipliers for providing first and second currents to be multiplied by said first and second signals;
   output means coupled to said analog multipliers for generating an output signal shifted by said input phase delay value, said output signal being combined from said first and second signals multiplied by said first and second currents, respectively.

9. A phase shift vernier according to claim 8, wherein each of said analog multipliers comprises:
   first pair of transistors having emitters connected together to receive said first quadrature output from each differential stage of said ring oscillator means;

second pair of transistors having emitters connected together to receive said second quadrature output, said first and second pairs being crosscoupled;

first driver pair coupled to said first pair of transistors for providing fixed and variable currents to said first pair of transistors when driven at their bases;

second driver pair coupled to said second pair of transistors for providing said fixed and variable currents to said second pair of transistors when driven at bases thereof.

10. A phase shift vernier according to claim 1, wherein said oscillating signal has a predetermined frequency at 800 MHz and is circulated by said ring oscillator means through four differential stages.

11. A phase shift vernier according to claim 10, wherein each of said four differential stages generates inverting and non-inverting outputs.

* * * * *